(12) United States Patent
Schafer et al.

(10) Patent No.: US 10,164,177 B2
(45) Date of Patent: Dec. 25, 2018

(54) METHOD AND SYSTEM FOR PROVIDING A MAGNETIC JUNCTION USABLE IN SPIN TRANSFER TORQUE APPLICATIONS USING A POST-PATTERN ANNEAL

(71) Applicant: Samsung Electronics Co., LTD., Gyeonggi-do (KR)

(72) Inventors: Sebastian Schafer, Fremont, CA (US); Dmytro Apalkov, San Jose, CA (US); Vladimir Nikitin, Campbell, CA (US); Don Koun Lee, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/445,695

(22) Filed: Feb. 28, 2017

(65) Prior Publication Data

US 2018/0205009 A1    Jul. 19, 2018

Related U.S. Application Data

(60) Provisional application No. 62/447,763, filed on Jan. 18, 2017.

(51) Int. Cl.
| | |
|---|---|
| *H01L 43/12* | (2006.01) |
| *H01L 43/08* | (2006.01) |
| *H01L 43/02* | (2006.01) |
| *H01L 43/10* | (2006.01) |
| *G11C 11/16* | (2006.01) |

(52) U.S. Cl.
CPC ............ *H01L 43/12* (2013.01); *G11C 11/161* (2013.01); *H01L 43/02* (2013.01); *H01L 43/08* (2013.01); *H01L 43/10* (2013.01)

(58) Field of Classification Search
CPC ...................................................... H01L 43/12
See application file for complete search history.

(56) References Cited

U.S. PATENT DOCUMENTS

| | | |
|---|---|---|
| 6,376,259 B1 | 4/2002 | Chu |
| 6,756,237 B2 | 6/2004 | Xiao |
| 8,852,960 B2 | 10/2014 | Kim |
| 9,006,849 B2 | 4/2015 | Guo |

(Continued)

*Primary Examiner* — Wael Fahmy
*Assistant Examiner* — Sarah Salerno
(74) *Attorney, Agent, or Firm* — Van Pelt, Yi & James LLP

(57) ABSTRACT

A magnetic junction usable in a magnetic device and a method for providing the magnetic junction are described. A first portion of a magnetoresistive stack corresponding to the magnetic junction is provided. Providing this portion of the magnetoresistive stack includes providing at least one layer for a free layer of the magnetic junction. A second portion of the magnetoresistive stack is provided after the step of providing the first portion of the magnetoresistive stack. The magnetoresistive stack is patterned to provide the magnetic junction after the step of providing the second portion of the magnetoresistive stack. An ambient temperature for the magnetoresistive stack and the magnetic junction does not exceed a crystallization temperature of the free layer after the step of providing the free layer through the step of patterning the magnetoresistive stack. The magnetic junction is annealed at an anneal temperature not less than the crystallization temperature after the step of patterning the magnetoresistive stack.

17 Claims, 8 Drawing Sheets

(56) References Cited

U.S. PATENT DOCUMENTS

| | | |
|---|---|---|
| 9,034,149 B2 | 5/2015 | Zheng |
| 9,281,168 B2 | 3/2016 | Mudivarthi |
| 9,331,271 B2 | 5/2016 | Horng |
| 9,472,754 B2 | 10/2016 | Hu |
| 2006/0221510 A1* | 10/2006 | Parkin .................... B82Y 10/00 360/324.2 |
| 2013/0168788 A1* | 7/2013 | Wang ................... G01R 33/098 257/421 |
| 2014/0070344 A1* | 3/2014 | Khalili Amiri ......... H01L 43/08 257/421 |
| 2014/0248719 A1* | 9/2014 | Zhou .................... G11C 11/161 438/3 |

* cited by examiner

METHOD AND SYSTEM FOR PROVIDING A MAGNETIC JUNCTION USABLE IN SPIN TRANSFER TORQUE APPLICATIONS USING A POST-PATTERN ANNEAL

CROSS-REFERENCE TO RELATED APPLICATIONS

This application claims the benefit of provisional Patent Application Ser. No. 62/447,763, filed Jan. 18, 2017, entitled POST-PATTERN MAGNETIC TUNNELING JUNCTION ANNEAL FOR SINGLE-GRAIN SMALL BITS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ includes a conventional pinned layer, a conventional free layer and a conventional tunneling barrier layer between the conventional pinned and free layers. The conventional MTJ typically resides on a substrate and may include conventional seed and capping layer(s) as well as a conventional antiferromagnetic (AFM) layer. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer and the conventional pinned layer may each be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM and for reducing the size of the magnetic junction are desired. However, a reduction in the lateral dimensions of the free layer may exhibit reduced thermal stability and an increased distribution in the minimum write current (or critical current density, $J_c$), the thermal stability constant $\Delta$, coercivity ($H_c$), magnetic anisotropy ($H_k$), shift field experienced ($H_{shift}$) and/or other magnetic properties. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. A first portion of a magnetoresistive stack corresponding to the magnetic junction is provided. Providing this portion of the magnetoresistive stack includes providing at least one layer for a free layer of the magnetic junction. A second portion of the magnetoresistive stack is provided after the step of providing the first portion of the magnetoresistive stack. The magnetoresistive stack is patterned to provide the magnetic junction after the step of providing the second portion of the magnetoresistive stack. An ambient temperature for the magnetoresistive stack and the magnetic junction does not exceed a crystallization temperature of the free layer after the step of providing the free layer through the step of patterning the magnetoresistive stack. The magnetic junction is annealed at an anneal temperature not less than the crystallization temperature after the step of patterning the magnetoresistive stack.

DETAILED DESCRIPTION OF THE INVENTION

Figure 1:
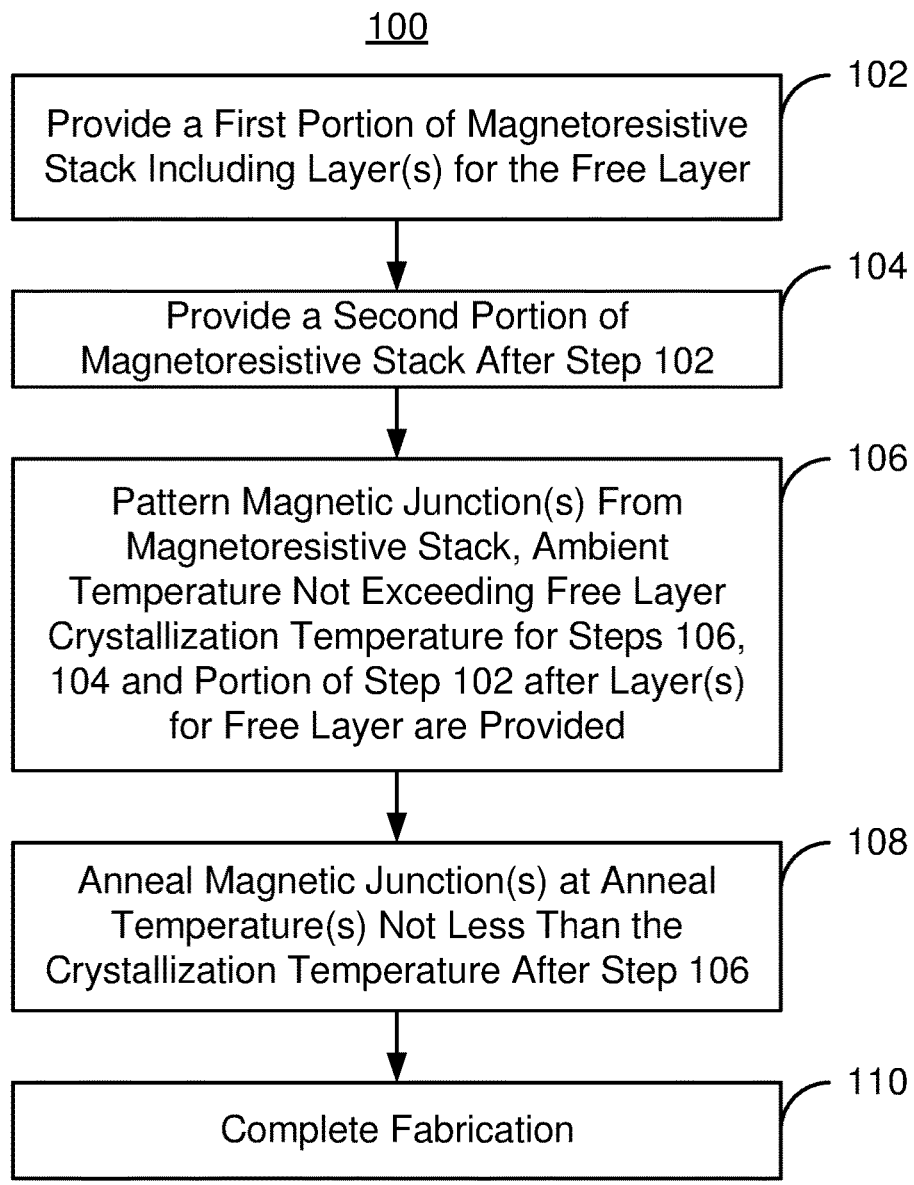
FIG. 1 is a flow chart depicting an exemplary embodiment of a method for providing a magnetic junction that may have a single crystal free layer at smaller lateral dimensions and usable in a magnetic devices such as a magnetic memory programmable using spin transfer torque.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and a method for providing the magnetic junction are described. A first portion of a magnetoresistive stack corresponding to the magnetic junction is provided. Providing this portion of the magnetoresistive stack includes providing at least one layer for a free layer of the magnetic junction. A second portion of the magnetoresistive stack is provided after the step of providing the first portion of the magnetoresistive stack. The magnetoresistive stack is patterned to provide the magnetic junction after the step of providing the second portion of the magnetoresistive stack. An ambient temperature for the magnetoresistive stack and the magnetic junction does not exceed a crystallization temperature of the free layer after the step of providing the free layer through the step of patterning the magnetoresistive stack. The magnetic junction is annealed at an anneal temperature not less than the crystallization temperature after the step of patterning the magnetoresistive stack.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, crystallization and other physical phenomenon. Consequently, one of ordinary skill in the art will readily recognize that theoretical explanations of the behavior of the method and system are made based upon this current understanding. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

FIG. 1 is a flow chart depicting an exemplary embodiment of a method for providing magnetic junction(s) that may have a single crystal, or single grain, free layer at lower lateral dimensions. In some embodiments, the magnetic junction may be single grain for lateral dimensions not exceeding twenty nanometers. Such magnetic junctions may be usable in a magnetic devices such as a STT-MRAM and, therefore, in a variety of electronic devices. The magnetic junction formed using the method 100 includes at least a free layer having a changeable magnetic moment, a pinned layer and a nonmagnetic spacer layer such as a crystalline MgO layer. The free and/or pinned layers of the magnetic junction may have a high perpendicular magnetic anisotropy (PMA). Stated differently, the perpendicular magnetic anisotropy energy may exceed the out-of-plane demagnetization energy. Such a configuration allows for the magnetic moment of a high PMA layer to be stable perpendicular to plane. FIGS. 2-5 depict an exemplary embodiment of a magnetic device 200 including magnetic junctions during fabrication. FIGS. 2-5 thus depict an exemplary embodiment of magnetic junction(s) that may be fabricated using the method 100. FIGS. 2-5 are not to scale and only structures of interest are separately labeled and included. Referring to FIGS. 1-5, the method 100 is described in the context of the magnetic device 200 including particular magnetic junctions. However, other magnetic devices including other magnetic junction(s) may be formed. Further, the method 100 may start after other steps in forming the magnetic device 200 have been performed. For simplicity, some steps may be omitted, performed in another order, include substeps and/or combined.

A first portion of a magnetoresistive stack is provided, via step 102. The magnetoresistive stack includes layers for the magnetic junction, but has not been patterned into individual magnetic junction(s). Thus, step 102 includes depositing one or more layers that will become part of the magnetic junction(s) after patterning. The first portion of the magnetoresistive stack includes layer(s) for the free layer. Step 102 thus explicitly includes depositing one or more layers of the free layer. If the magnetic junction is a bottom pinned magnetic junction (pinned layer closer to the substrate than the free layer), then step 102 includes providing the layers for the pinned layer, nonmagnetic spacer layer and free layer. Other layers such as polarization enhancement layers (PELs), coupling layers and antiferromagnetic (AFM) or other pinning layers and/or other layers between the substrate and the free layer may be deposited. If the magnetic junction being formed is a dual magnetic junction, then step 102 includes depositing the layers for at least the bottom pinned layer, the bottom nonmagnetic spacer layer and the free layer. If the magnetic junction is a top pinned magnetic junction (free layer closer to the substrate than the pinned layer), then step 102 includes providing the layers for the free layer and any layers closer to the substrate than the free layer, such as seed layers. For such a top pinned magnetic junction, deposition of the nonmagnetic spacer layer and pinned layer are not part of step 102.

In some embodiments, the free layer is a single layer. In other embodiments, the free layer includes multiple layers. At least one of these layers is a magnetic layer that includes magnetic material(s) and at least one dilution material. For example, such a magnetic layer may include CoFe as the magnetic material and one or more of Mo, B, Be Si, SiO and SiN as the dilution material(s). Other magnetic material(s) and/or dilution material(s) may be used. In general, the magnetic layer is desired to have not more than twenty atomic percent of the dilution material(s). In some embodiments, the magnetic layer includes not more than ten atomic percent of the dilution material(s). In some cases, less than ten atomic percent of the dilution materials are used. For example, the magnetic layer may include nominally five atomic percent of B, Be, Mo, Si, SiO, SiN and/or other dilution material. In some embodiments, the magnetic layer is a CoFeB layer. A CoFeB layer may be a $(CoFe)_{1-x}B_x$ layer, where x is greater than zero and not more than 0.2. Alloys mentioned herein do not indicate specific stoichiometries unless specifically mentioned. In general, the dilution materials are used to allow the magnetic layer to have an amorphous structure as-deposited. Step 102 thus includes deposition of one or more such magnetic layers for the free layer.

Each magnetic layer is having dilution material(s) is amorphous as-deposited, but has a crystallization temperature. The crystallization temperature is the temperature at which the magnetic layer transitions from an amorphous structure to a crystalline lattice structure. For some magnetic layers, the crystallization temperature may be three hundred degrees Celsius or more. In some magnetic layers the crystallization temperature is at least three hundred twenty five degrees Celsius. In other embodiments, the crystallization temperature of the magnetic layer is at least three hundred fifty degrees Celsius. For example, a CoFeB magnetic layer may have a crystallization temperature of nominally 325-350 degrees Celsius. If the free layer includes multiple magnetic layers, then the crystallization temperature of the free layer is the crystallization temperature of one of the layers. In some embodiments, the crystallization temperature of the free layer is the lowest crystallization temperature of the magnetic layers. In other embodiments a different crystallization t, such as the highest, may be considered the crystallization temperature of the free layer. Alternatively the free layer may be considered to have multiple crystallization temperatures. One of ordinary skill in the art will recognize that crystallization of an amorphous layer is based both on the ambient temperature of the environment in which the amorphous layer resides as well as the time the amorphous layer is at that ambient temperature. A lower (but still elevated) temperature may crystallize an amorphous layer if the amorphous layer is subjected to the temperature for a longer time.

As part of step 102, the magnetoresistance stack may be exposed to temperatures in excess of the crystallization temperature(s) of the magnetic layer(s) of the free layer as long as this exposure occurs before deposition of these magnetic layer(s). For example, if a bottom pinned or dual magnetic junction is formed, then MgO for a nonmagnetic spacer layer (i.e. a tunneling barrier layer) may be deposited before the free layer. In such a case, step 102 may include annealing the deposited layers after MgO is deposited and before the magnetic layer(s) of the free layer are deposited. This may allow the formation of crystalline MgO before deposition of the magnetic layer(s). However, once the magnetic layer(s) are deposited, the ambient temperature for magnetoresistive stack does not exceed the crystallization temperature of the free layer. In some embodiments, the ambient temperature is less than the crystallization temperature of the free layer once the magnetic layer(s) are deposited. For example, the ambient temperature may remain at least fifty degrees Celsius or at least one hundred degrees Celsius less than the crystallization temperature after deposition of the magnetic layer(s). The ambient temperature may be considered to be the temperature of the chuck to which the substrate such as a wafer is attached. The ambient temperature may also be considered the temperature of the gas/vacuum in the chamber(s) in which the magnetoresistive stack resides. Either or both of these temperatures, as well as other measures of the temperature of the environment to which the magnetoresistive stack is exposed, may be considered to be the ambient temperature. It is possible that there may be local hot spots on the magnetoresistive stack that exceed the crystallization temperature after deposition of the free layer. For example, during sputtering of a subsequent layer, the local temperature at a region of the surface of the magnetoresistive stack might exceed three hundred degrees Celsius, but ambient temperature of the stack does not. In some embodiments, maintaining the ambient temperature of the magnetoresistive stack at temperature(s) less than or equal to the crystallization temperature is carried out simply by omitting any anneals at temperatures close to, equal to or above the crystallization temperature. As a result, the magnetic layer(s) of the free layer retain their amorphous crystal structure.

A second portion of the magnetoresistive stack is provided, via step 104. Step 104 occurs after step 102. Step 104 may include depositing one or more of the layers above the free layer. For example, layers corresponding to a PMA enhancing layer such as an MgO layer, a PEL and/or other capping layers might be provided. If the magnetic junction being formed is a bottom pinned magnetic junction, then step 104 may include depositing a capping layer. If the magnetic junction being formed is a dual magnetic junction, then the additional/top nonmagnetic spacer layer, additional/top pinned layer and other layer(s) are deposited as part of step 104. If the magnetic junction being formed is a top pinned magnetic junction, then step 104 includes depositing the nonmagnetic spacer layer and the pinned layer. Capping and/or other layers may also be deposited in step 104. However, no anneal is performed. As discussed above, the ambient temperature remains or is maintained below the crystallization temperature of the free layer. Using steps 102 and 104, the magnetoresistive stack is provided.

Figure 2:
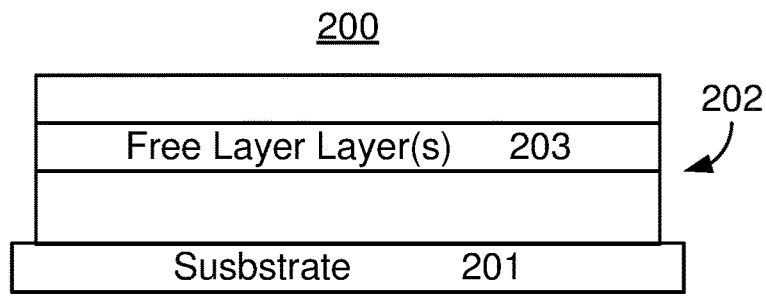
FIGS. 2-5 depict an exemplary embodiment of a magnetic junction during fabrication, which may have a single crystal free layer at smaller lateral dimensions and usable in a magnetic devices such as a magnetic memory programmable using spin transfer torque.

FIG. 2 depicts an exemplary embodiment of a portion of a magnetic device 200 after step 104 is performed. Thus, the magnetoresistive stack 202 has been formed on the substrate 201. The magnetoresistive stack 202 includes layers 203 for the free layer. In some embodiments, only a single, magnetic layer having dilution material(s) is included in the free layer 203. In other embodiments, the magnetic layer and magnetic and/or nonmagnetic layer(s) may be part of the free layer. Pinned layer(s), nonmagnetic spacer layer(s), seed layer(s), capping layer(s), any PEL(s) and other layers that might be present are not explicitly depicted. The magnetic layer(s) including the dilution material(s) are included in the free layer 203, but not shown for simplicity. Such magnetic layer(s) are amorphous as-deposited and thus would be amorphous in FIG. 2.

The magnetoresistive stack 202 is then patterned, via step 106. As a result, one or more magnetic junctions are formed from the magnetoresistive stack. Step 106 generally includes providing a mask covering the regions of the magnetoresistive stack that will form the magnetic junction(s) and performing a reactive ion etch (RIE) and/or other removal process. From deposition of the magnetic layer(s) of the free layer through the patterning step 106, the ambient temperature for the magnetoresistive stack and the magnetic junction(s) does not exceed the crystallization temperature of the free layer. In some cases, the ambient temperature is less than the crystallization temperature. The ambient temperature may be significantly below the crystallization temperature is some embodiments. For example, the ambient temperature may be fifty degrees Celsius, one hundred degrees Celsius or more below the crystallization temperature through step 106.

Figure 3:
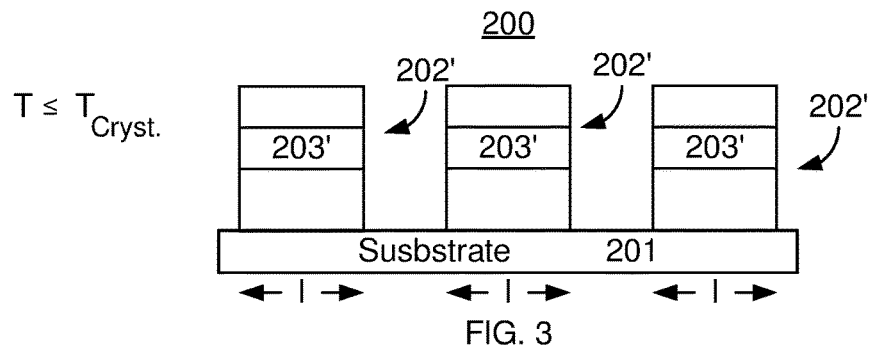

FIG. 3 depicts an exemplary embodiment of a portion of a magnetic device 200 after step 106 is performed. Magnetic junctions 202' have been defined from the magnetoresistive stack 202. Each magnetic junction 202' includes at least one free layer 203'. The magnetic layer of the free layer 203' remains amorphous because the ambient temperature has remained sufficiently below the crystallization temperature. The lateral size of the magnetic junctions 202' is shown as I. In some embodiments, I does not exceed twenty nanometers. In some embodiments, I may be less than twenty nanometers. For example, I may be fifteen nanometers or less. In some embodiments, the lateral dimension of the magnetic junctions 203 do not exceed ten nanometers. Although the entire magnetic junction 202' is shown as having the lateral dimension I, in some embodiments, the free layer 203' has the lateral dimension I, but other layer(s) may have a different lateral dimension. For example, the pinned layer may extend further in the lateral dimensions than the free layer 203'. The free layer 203' is magnetic and may be switchable between stable magnetic states when a write current is passed through the magnetic junction 203'. For example, current may be driven substantially perpendicular to the plane of the substrate 201 (CPP) to switch the free layer using STT. In other embodiments, other and/or additional switching mechanisms might be used.

Figure 4:
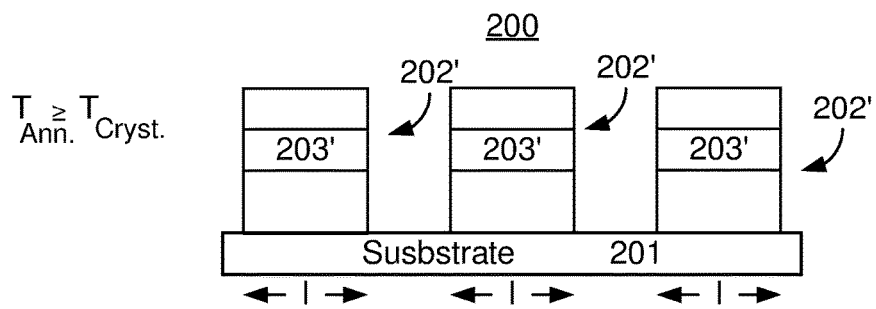

The magnetic junctions 203' are annealed at anneal temperature(s) not less than the crystallization temperature, via step 108. Step 108 occurs after the step of patterning the magnetoresistive stack in step 106. In some embodiments, the space between the magnetic junctions 203' is refilled with an insulator and electrical contacts provided to the magnetic junctions 203' before step 108. In such an embodiment, a voltage may be applied across the magnetic junction 203' during annealing in step 108. In other embodiments, the voltage is not applied during annealing. In some such embodiments, step 108 may occur before the refill step is performed and before electrical contacts are provided. The anneal may thus occur at the back end of line of fabrication or in line, for example immediately after step 106 is completed. FIG. 4 depicts an exemplary embodiment of a portion of a magnetic device 200 during step 108. For simplicity, no refill material or electrical contacts are shown. The magnetic junctions 203' are exposed to temperature(s) greater than or equal to the crystallization temperature(s) for a desired amount of time. For example, the anneal may be at temperature(s) greater than three hundred. In some embodiments, the anneal temperature(s) may be at least three hundred twenty-five degrees Celsius. In some such embodiments, the anneal temperature(s) are at least three hundred fifty degrees Celsius. In some embodiments, the anneal temperatures may be four hundred degrees Celsius or more. However, the anneal temperature is generally desired not to exceed six hundred degrees Celsius. Because of the anneal, the magnetic layer(s) of the free layer 203' undergo crystallization.

Fabrication of the magnetic device 200 may then be completed, via step 110. For example, the insulating refill and electrical contacts may be formed if they had not already been fabricated. If the lateral dimension(s) of the magnetic junctions 203' are desired to be smaller, than an ion beam etch or other removal process may be carried out. Other structures, such as bit lines and/or word lines may also be formed.

Figure 5:
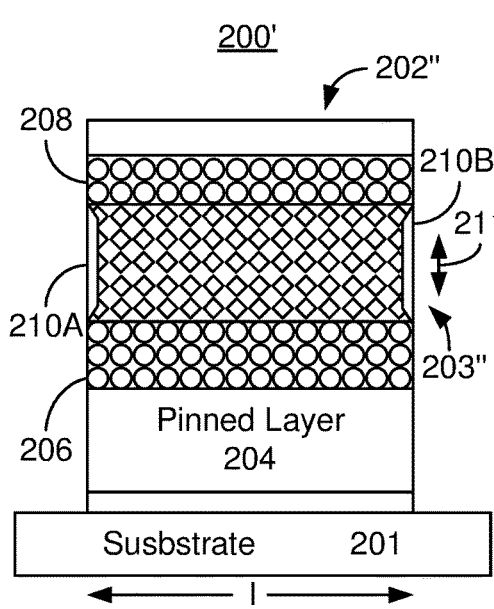

FIG. 5 depicts an exemplary embodiment of the magnetic device 200' after fabrication is completed. For simplicity electrical contacts that might reside on top of and below the magnetic junction 202" are not shown. Such contacts may be used in developing a voltage across the magnetic junction 202" during annealing and/or for driving a current through the magnetic junction 202" during STT switching. Any insulating material adjacent to the magnetic junction 202" is also not shown. FIG. 5 is not to scale and not all components are shown or labeled.

The magnetic junction 202" is formed using the method 100. The magnetic junction 202" resides on the substrate 201 and includes a pinned layer 204, a tunneling barrier layer 206, a free layer 203" and an optional PMA enhancement layer 208. The magnetic junction 202" shown is a bottom pinned magnetic junction. In an alternate embodiment, the orientation of the layers 204, 206 and 203" may be reversed to form a top pinned magnetic junction. In such an embodiment, the layer 208 may be between the free layer 203" and the substrate 201, forming a seed layer. In the embodiment shown, the tunneling barrier layer 206 and the PMA enhancement layer 208 are crystalline MgO layers. The crystalline nature of the layers 206 and 20 may be seen by the regular arrangement of the MgO (shown as circles in the layers 206 and 208) into a lattice. In other embodiments, the tunneling barrier layer 206 and/or the PMA enhancement layer 208 may be formed of other materials. The pinned layer 204 is magnetic and may have its moment (not shown) substantially fixed, or pinned. In some embodiments, the pinned layer 204 has a perpendicular magnetic anisotropy energy that exceeds the pinned layer out-of-plane demagnetization energy. Thus, the magnetic moment of the pinned layer 204 may be stable substantially perpendicular-to-plane. The pinned layer 204 may be a single layer or a multilayer including but not limited to a synthetic antiferromagnet.

The free layer 203" may have a high perpendicular magnetic anisotropy. Stated differently, the perpendicular magnetic anisotropy energy may exceed the out-of-plane demagnetization energy for the free layer 203". The free layer 203" magnetic moment 211 is stable substantially perpendicular to plane. For simplicity, the free layer 203" shown consists of a magnetic layer including magnetic material(s) and dilution material(s). In other embodiments, the free layer 203" may have other layers, including but not limited to other magnetic layers including dilution material(s). Also shown is the lattice for the free layer 203" and the dilution materials 210A and 210B, which have segregated to the edges of the free layer 203" during the anneal. Although no dilution material is shown in the central portion of the free layer 203", some dilution material may remain. The central portion of the free layer 203" is predominantly the magnetic material, which has crystallized and templated off of the crystalline MgO layer 206. The crystallization of the free layer 203" may be seen by the arrangement of the magnetic material (diamonds in the free layer 203") in a lattice at the central portion of the free layer 203".

Because the magnetic junction 202" was annealed after step 106, the free layer 203" may be single crystal or close to single crystal. In other embodiments, the free layer 203" may have more than one grain. In either case, the number of grains in the free layer 203" may be reduced, the grain sized may be increased and the orientation and other crystallographic properties more tightly distributed.

Although the method 100 and/or magnetic junction produced are not dependent upon a particular physical explanation, the reduction in the number of grains, the tighter distribution of grain axes and the increase in size of the grains for the free layer 203" may be understood as follows. Grain formation may be caused by a lattice mismatch with the underlying layer and/or the presence of dilution materials. A larger lattice mismatch with the underlying layer may cause more and smaller grains to be formed during an anneal. Similarly, dislocations in the lattice at locations of the dilution materials may result in formation of a grain boundary during the anneal. For a large continuous film being annealed, these mechanisms may lead to formation of grains at random positions. Stated differently, the locations of grain boundaries may be random throughout the plane of the layer 203. The characteristic size of the grains so formed is on the order of five nanometers for an anneal of the full film (full film characteristic grain size≈5 nm). The orientations of the grains may also differ.

If the magnetic junction is defined from the magnetoresistive stack after the anneal, the properties of the free layer depend upon the lateral extent of the free layer. For magnetic junctions in which the lateral dimension, I, is large compared to the full film characteristic grain size, the free layer has numerous grains. Such a free layer may have any issues related to the random nature of the grains averaged out. The distribution in the properties of the free layer may be sufficiently narrow. At smaller lateral dimensions of the free layer, for example I being less than or equal to twenty nanometers, there is a small number of grains. For example, the free layer may contain on the order of two through five grains. Grains having different orientations or other slightly different characteristics drastically affect the distribution of the characteristics. Consequently, the characteristics of the free layer would be affected by the random nature of the grain formation. As a result, the PMA of the free layer may be reduced, the anisotropy, coercivity and shift field of the free layer may change. The magnetoresistance may also be adversely affected. Performance of a magnetic junction having a free layer formed in this manner and small lateral dimensions may suffer.

In contrast, annealing after the magnetic junctions 203'/203" has been defined in step 106 allows the dilution material(s) 210A and 210B to segregate to the sides of the free layer 203" during the anneal. Such a situation may be seen in FIG. 5. The dilution material(s) 210A and 210B have diffused to the edges of the free layer 203". Because of the dilution materials 210A/210B tend to segregate to the edges, dislocations tend to appear at the edges of the magnetic junction 202". Such dislocations may be less apt to result in grain boundaries within the free layer 203" if the lateral dimension I is not significantly larger than the full film characteristic grain size. For example, I may be less than or equal to twenty nanometers for a five nanometer full film characteristic grain size. For such lateral dimensions, the dilution materials 210A/210B segregate at the edges and are less likely to result in formation of a grain boundary. The free layer 203" is more likely to include only a single grain.

Also during the anneal, the remaining magnetic material(s) form a crystal structure that templates off of the crystalline tunneling barrier layer 206 and the PMA enhancement layer 208. Although shown in FIG. 5 as having substantially the same lattice parameter, in some embodiments, the lattice parameters of the layers 203" and 206 and/or the lattice parameters of the layer 203" and 208 may differ by as much as five to ten percent. Because of the small lattice mismatch and the anneal with the layers 206 and 208 and because of the segregation of the dilution material, the grain size may be increased and the distribution of the properties of the free layer 203" may be narrowed. Stresses due to the lattice mismatch build up only within the size of the magnetic junction 202'. Thus, the stress due to the lattice mismatch may be mitigated. Again, fewer and larger grains tend to form in the free layer 203". In some embodiments, the characteristic grain size is greater than five nanometers. For example, the characteristic grain size may be at least ten nanometers. In some embodiments, the characteristic grain size may be approximately twenty nanometers or larger. The free layer 203" may have the desired perpendicular magnetic anisotropy, coercivity, shift field and magnetoresistance in part because the free layer 203" may have fewer grains/may consist of a single grain. Thus, performance of the magnetic junction 202" may be improved.

Figure 6:
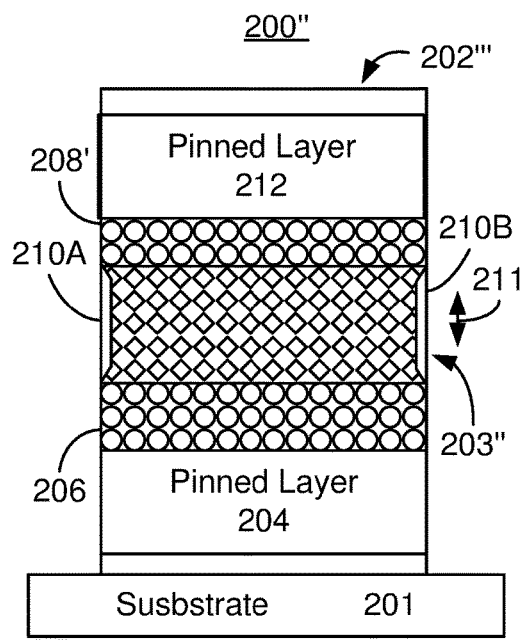
FIG. 6 depicts another exemplary embodiment of a magnetic junction that may have a single crystal free layer at smaller lateral dimensions and usable in a magnetic devices such as a magnetic memory programmable using spin transfer torque.

FIG. 6 depicts another exemplary embodiment of the magnetic device 200" after fabrication is completed. For simplicity electrical contacts that might reside on top of and below the magnetic junction 202'" are not shown. Such contacts may be used in developing a voltage across the magnetic junction 202'" during annealing and/or for driving a current through the magnetic junction 202'" during STT switching. Any insulating material adjacent to the magnetic junction 202'" is also not shown. FIG. 6 is not to scale and not all components are shown or labeled. Components of the magnetic junction 202''' are analogous to those of the magnetic junction 202'' depicted in FIG. 5.

The magnetic junction 202''' is formed using the method 100. The magnetic junction 202''' resides on the substrate 201 and includes a pinned layer 204, a tunneling barrier layer 206 and a free layer 203'' having a magnetic moment 211 that are analogous to the pinned layer 204, the tunneling barrier layer 206 and the free layer 203'' having magnetic moment 211, respectively. The free layer 203'' of the magnetic junction 202'' thus has a larger grain size and may be a single crystal. The free layer 203'' shown consists of a magnetic layer including magnetic material(s) and dilution material(s). In other embodiments, the free layer 203'' may have other layers, including but not limited to other magnetic layers including dilution material(s). Also shown is the lattice for the free layer 203'' and the dilution material(s) 210A and 210B that have segregated to the sides of the free layer 203''. Thus, the free layer 203'' may provide analogous advantages to those discussed for the free layer 203'' of the magnetic junction 202''.

The magnetic junction 202''' also includes an additional tunneling barrier layer 208' and an additional pinned layer 212. The pinned layer 212 and additional tunneling barrier 211 may be analogous to the pinned layer 204 and tunneling barrier layer 206, respectively. Thus, the magnetic junction 202''' is a dual magnetic junction. Although not shown, the magnetic junction 202''' may include PEL layer(s) and/or other layers.

The magnetic junction 202''' shares the benefits of the magnetic junctions 202' and 202''. The free layer 203'' may have a high perpendicular magnetic anisotropy and may be a single crystal or contain only a few grains. The dilution material(s) 210A and 210B may segregate to the edges of the free layer 203. The remaining magnetic material(s) form a crystal structure that templates off of the crystalline tunneling barrier layers 206 and 208'. The free layer 203'' grain size may be increased and the distribution of the properties of the free layer 203'' may be narrowed. The free layer 203'' may thus have the desired perpendicular magnetic anisotropy, coercivity, shift field and magnetoresistance. Thus, performance of the magnetic junction 202'' may be improved.

Figure 7:
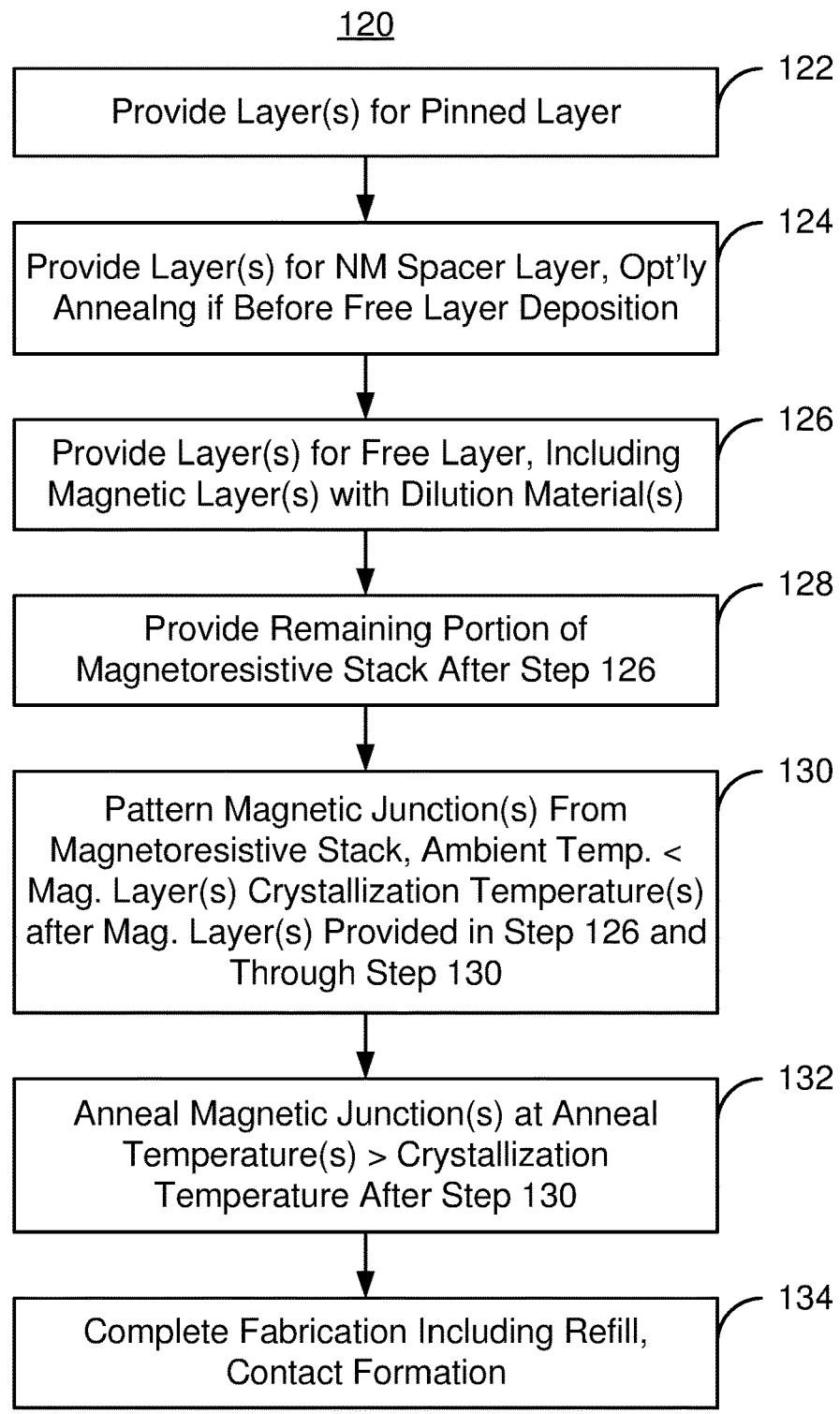
FIG. 7 is a flow chart depicting another exemplary embodiment of a method for providing a magnetic junction that may have a single crystal free layer at smaller lateral dimensions and usable in a magnetic devices such as a magnetic memory programmable using spin transfer torque.

FIG. 7 is a flow chart depicting an exemplary embodiment of a method 120 for providing magnetic junction(s) that may have a single crystal free layer at lateral dimensions not exceeding twenty nanometers. Such magnetic junctions may be usable in a magnetic devices such as a STT-MRAM and, therefore, in a variety of electronic devices. The magnetic layers of the magnetic junction may have a high PMA. For simplicity, some steps may be omitted, performed in another order, include substeps and/or combined. Further, the method 120 may start after other steps in forming a magnetic memory have been performed.

The layers for the pinned layer are provided, via step 122. The portion of the magnetoresistive stack corresponding to the pinned layer is provided in this step. Step 122 may include depositing one or more magnetic layers. Nonmagnetic layer(s) may also be deposited as part of step 122. For example, a Co/Pt multilayer and/or other layer(s) having a high PMA may be deposited in step 122. If the layers for the pinned layer are provided before the relevant magnetic layer(s) of the free layer in step 126 (discussed below), then step 122 may also include an anneal or other exposure of the layers to an ambient temperature in excess of the crystallization temperature(s) of the magnetic layer(s) of the free layer. However if step 122 is performed after the magnetic layers are provided in step 126, then step 122 includes ensuring that the portion magnetoresistive stack already formed is not exposed to an ambient temperature in excess of the free layer crystallization temperature(s).

The layer(s) for the nonmagnetic spacer layer are provided, via step 124. Step 124 may include depositing an MgO layer, depositing an Mg layer and oxidizing the layer, depositing and oxidizing multiple Mg layers or other analogous steps. Alternatively, one or more conductive layers may be deposited. Other embodiments may include formation of other layer(s) for the nonmagnetic spacer layer. If step 124 is performed before the relevant magnetic layer(s) of the free layer are provided in step 126, then an anneal may optionally be performed as part of step 124. Such an anneal may be used to crystallize an MgO layer in the desired orientation. If, however, step 124 is performed after the magnetic layer(s) of the free layer are formed in step 126, then step 124 includes ensuring that the portion magnetoresistive stack already formed is not exposed to an ambient temperature in excess of the free layer crystallization temperature(s).

The layer(s) for the free layer are provided, via step 126. Step 126 includes depositing one or more magnetic layers that include magnetic material(s) and dilution materials. The magnetic material(s) include but are not limited to CoFe and Fe. The dilution material(s) may include materials such as B, Be, Mo, Si, SiO and/or SiN. The dilution material(s) may be considered glass-forming materials because the presence of the dilution material(s) may allow the magnetic layer to be amorphous as-deposited. In some embodiments, only such a magnetic layer is provided in step 126. In such cases, the free layer consists of the magnetic layer. In other embodiments, other magnetic layers that include dilution material(s) are also deposited. Magnetic material(s) excluding such dilution material(s) and/or nonmagnetic layers may also be deposited as part of step 126. If steps 122, 124 and 126 are carried out in order, then the magnetic junctions being formed are either bottom pinned or dual magnetic junctions. If step 126 is performed before steps 122 and 124, then top pinned magnetic junctions are formed.

A remaining portion of the magnetoresistive stack is provided after the free layer have been deposited, via step 128. Step 128 occurs after steps 122, 124 and 126. Step 128 may include depositing one or more of the layers above the free layer. For example, layers corresponding to a PMA enhancing layer such as an MgO layer, a PEL and/or other capping layers might be provided. If the magnetic junction being formed is a dual magnetic junction, then the additional/top nonmagnetic spacer layer, additional/top pinned layer and other layer(s) are deposited as part of step 126. However, as discussed above, the ambient temperature remains or is maintained below the crystallization temperature of the free layer because step 128 occurs after step 126. Steps 122, 124, 126 and 128 correspond to steps 102 and 104 of the method 100.

The magnetoresistive stack is then patterned, via step 130. As a result, one or more magnetic junctions are formed from the magnetoresistive stack. Step 130 is analogous to step 106 of the method 100. Step 130 may include providing a mask covering the regions of the magnetoresistive stack that will form the magnetic junction(s) and performing an RIE and/or other removal process. From deposition of the magnetic layer(s) of the free layer in step 126 through the patterning in step 130, the ambient temperature for the magnetoresistive stack and the magnetic junction(s) does not exceed the crystallization temperature of the free layer. In some cases, the ambient temperature is less than the crystallization temperature. The ambient temperature may be significantly less than the crystallization temperature is some embodiments. For example, the ambient temperature may be fifty degrees Celsius, one hundred degrees Celsius or more less than the crystallization temperature. Step 130 is performed such that the lateral (in-plane) dimensions of at least the free layer are not more than twenty nanometers. In some embodiments, the lateral dimensions of the free layer do not exceed ten nanometers. In some embodiments, the entire magnetic junction has lateral dimensions corresponding to those of the free layer.

The magnetic junctions are annealed at anneal temperature(s) not less than the crystallization temperature, via step 132. Step 132 occurs after the step of patterning the magnetoresistive stack in step 130. In some embodiments, the space between the magnetic junctions is refilled with an insulator and electrical contacts provided to the magnetic junctions before step 130. In other embodiments, step 130 occurs before the refill step is performed and before electrical contacts are provided. Thus, the magnetic junctions are exposed to temperature(s) greater than or equal to the crystallization temperature(s) of the magnetic layer(s) of the free layer for a desired amount of time. For example, the anneal may be at temperature(s) greater than three hundred degrees Celsius. In some embodiments, the anneal temperature(s) may be at least three hundred twenty-five degrees Celsius. In some such embodiments, the anneal temperature(s) are at least three hundred fifty degrees Celsius. In some embodiments, the anneal temperatures may be four hundred degrees Celsius or more. Because of the anneal, the magnetic layer(s) of the free layer undergo crystallization and the dilution material(s) segregate to the sides of the free layer and, therefore, the sides of the magnetic junction.

Fabrication of the magnetic device may then be completed, via step 134. For example, the insulating refill and electrical contacts may be formed if they had not already been fabricated. If the lateral dimension(s) of the magnetic junctions 203' are desired to be smaller, than an ion beam etch or other removal process may be carried out. Other structures, such as bit lines and/or word lines may also be formed.

Using the method 120, magnetic junctions such as the magnetic junctions 202', 202" and/or 202''' may be formed. Such magnetic junctions may have a free layer with a high perpendicular magnetic anisotropy and may be a single crystal or contain only a few grains. The dilution material(s) 210A and 210B may segregate to the edges of the free layer 203. The remaining magnetic material(s) form a crystal structure that templates off of the crystalline tunneling barrier layers 206 and 208'. The free layer 203" grain size may be increased and the distribution of the properties of the free layer 203" may be narrowed. The free layer 203" may thus have the desired perpendicular magnetic anisotropy, coercivity, shift field and magnetoresistance. Thus, performance of the magnetic junction 202" may be improved.

Figure 8:
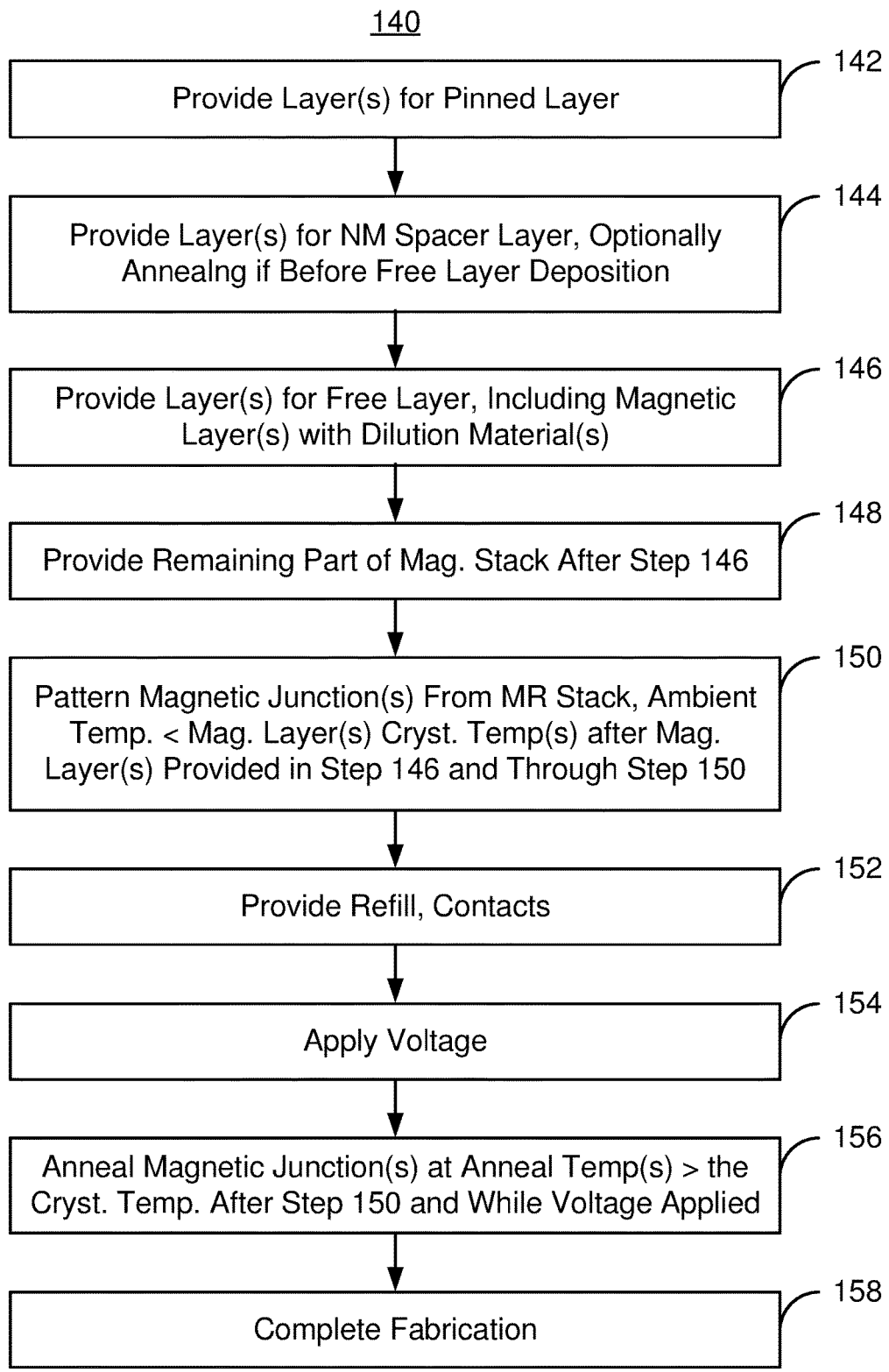
FIG. 8 is a flow chart depicting another exemplary embodiment of a method for providing a magnetic junction that may have a single crystal free layer at smaller lateral dimensions and usable in a magnetic devices such as a magnetic memory programmable using spin transfer torque.

FIG. 8 is a flow chart depicting an exemplary embodiment of a method 140 for providing magnetic junction(s) that may have a single crystal free layer at lateral dimensions not exceeding twenty nanometers. FIGS. 9-12 depict an exemplary embodiment of a magnetic device 220 including magnetic junctions 222 during fabrication using the method 140. The magnetic device 220 may be an STT-MRAM or other analogous device. FIGS. 9-12 are not to scale and only structures of interest are separately labeled and included. Referring to FIGS. 9-12, the method 140 is described in the context of the magnetic device 220 including particular magnetic junctions 222. However, other magnetic devices including other magnetic junction(s) may be formed. For simplicity, some steps may be omitted, performed in another order, include substeps and/or combined. Further, the method 140 may start after other steps in forming a magnetic memory have been performed.

The layers for the pinned layer are provided, via step 142. Step 142 is analogous to step 122, discussed above. If the layers for the pinned layer are provided before the relevant magnetic layer(s) of the free layer in step 146 (discussed below), then step 142 may also include an anneal or other exposure of the layers to an ambient temperature in excess of the crystallization temperature(s) of the magnetic layer(s) of the free layer. However if step 142 is performed after the magnetic layers are provided in step 146, then step 142 includes ensuring that the portion magnetoresistive stack already formed is not exposed to an ambient temperature in excess of the free layer crystallization temperature(s).

The layer(s) for the nonmagnetic spacer layer are provided, via step 144. Step 144 is analogous to step 124 of the method 120. If step 144 is performed before the relevant magnetic layer(s) of the free layer are provided in step 146, then an anneal may optionally be performed as part of step 144. Such an anneal may be used to crystallize the MgO layer in the desired orientation. If, however, step 144 is performed after the magnetic layer(s) of the free layer are formed in step 146, then step 144 includes ensuring that the portion magnetoresistive stack already formed is not exposed to an ambient temperature in excess of the free layer crystallization temperature(s).

The layer(s) for the free layer are provided, via step 146. Step 146 is analogous to step 126. Step 146 thus includes depositing one or more magnetic layers that include magnetic material(s) and dilution materials. The magnetic material(s) include but are not limited to CoFe and Fe. The dilution material(s) may include but are not limited to materials such as B, Be, Mo, Si, SiO and/or SiN. If steps 142, 144 and 146 are carried out in order, then the magnetic junctions being formed are either bottom pinned or dual magnetic junctions. If step 146 is performed before steps 142 and 144, then top pinned magnetic junctions are formed.

A remaining portion of the magnetoresistive stack is provided after the free layer have been deposited, via step 148. Step 148 is analogous to step 128. As discussed above, the ambient temperature remains or is maintained below the crystallization temperature of the free layer.

The magnetoresistive stack is then patterned, via step 150. Step 150 is analogous to step 130. From deposition of the magnetic layer(s) of the free layer in step 126 through the patterning in step 150, the ambient temperature for the magnetoresistive stack and the magnetic junction(s) does not exceed the crystallization temperature of the free layer. In some cases, the ambient temperature is less than the crystallization temperature. The ambient temperature may be significantly less than the crystallization temperature is some embodiments. For example, the ambient temperature may be fifty degrees Celsius, one hundred degrees Celsius or more less than the crystallization temperature. Step 150 is performed such that the lateral dimensions of at least the free layer are not more than twenty nanometers. In some embodiments, the lateral dimensions of the free layer do not exceed ten nanometers. In some embodiments, the entire magnetic junction has lateral dimensions corresponding to those of the free layer.

Figure 9:
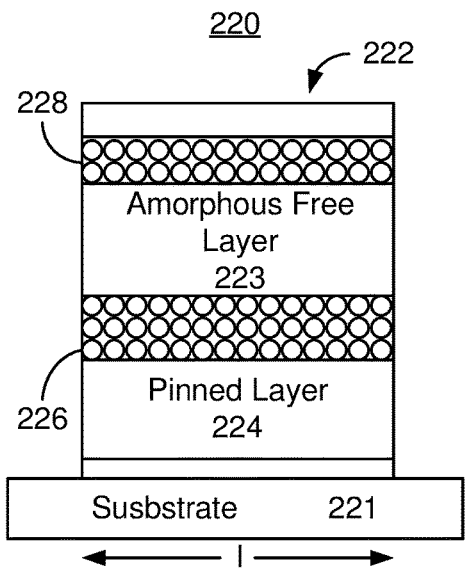
FIGS. 9-12 depict another exemplary embodiment of a magnetic junction during fabrication, which may have a single crystal free layer at lateral dimensions not exceeding twenty nanometers and usable in magnetic devices such as a magnetic memory programmable using spin transfer torque.

FIG. 9 depicts an exemplary embodiment of one magnetic junction 222 in the magnetic device 220 after step 150 is performed. Thus, a magnetic junction 222 having lateral dimension I≤20 nm is formed. Although only one magnetic junction 220 is shown, multiple may be present in the device 220. A pinned layer 224, nonmagnetic spacer layer 226 and free layer 223 are shown on the substrate 221. Also shown is an optional PMA enhancement layer 228. Other layers may be present but are not shown for clarity. In the embodiment shown, the magnetic junction 222 is a bottom pinned magnetic junction. However, a top pinned or dual magnetic junction may be formed instead. As can be seen in FIG. 9, the free layer 223 is termed an amorphous free layer. This is because the magnetic layer(s) within the free layer that include both magnetic material(s) and dilution material(s) are amorphous as-deposited. As discussed above, the ambient temperature to which the layer(s) in the free layer are exposed are modest in comparison with the crystallization temperature of the magnetic layer(s) of the free layer. As a result, the free layer 223 remains amorphous after the magnetic junction 222 has been defined.

Figure 10:
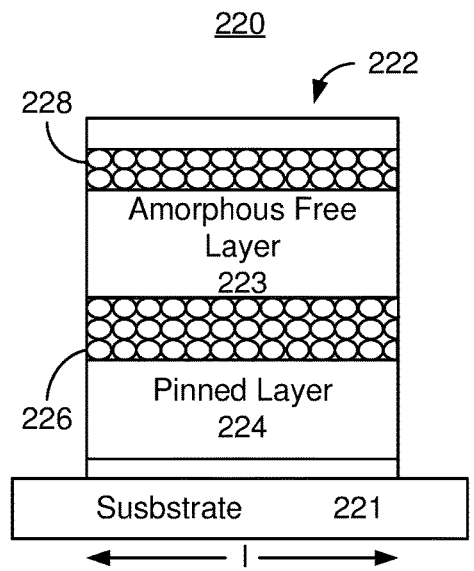

An insulating refill is provided between the magnetic junction(s) and electrical contact is made to the magnetic junction, via step 152. A voltage is applied to the magnetic junction 222 through the electrical contacts, via step 154. Thus, a voltage is developed between the top and the bottom of the magnetic junction 222. FIG. 10 depicts the magnetic junction while the voltage is applied in step 152. For simplicity, any electrical contacts and insulating refill material are not shown. Because the nonmagnetic spacer layer 226 is a tunneling barrier layer, the layer 226 may act as a capacitive barrier layer. The applied voltage may thus create a vertical stress on the magnetic junction 220. This vertical stress may result in a change in the lattice constant both in plane and perpendicular to plane. This may be seen in FIG. 10. The lattice constant perpendicular to plane has been reduced, while the in-plane lattice constant has been increased. The size of the change in the lattice constants may be tuned by the magnitude of the applied voltage.

The magnetic junctions are annealed at anneal temperature(s) not less than the crystallization temperature while the voltage is applied, via step 156. Step 156 occurs after the step of patterning the magnetoresistive stack in step 154. Thus, the magnetic junctions 222 are exposed to temperature(s) greater than or equal to the crystallization temperature(s) of the magnetic layer(s) of the free layer 223 for a desired amount of time. For example, the anneal may be at temperature(s) greater than three hundred. In some embodiments, the anneal temperature(s) may be at least three hundred twenty-five degrees Celsius. In some such embodiments, the anneal temperature(s) are at least three hundred fifty degrees Celsius. In some embodiments, the anneal temperatures may be four hundred degrees Celsius or more. Because of the anneal, the magnetic layer(s) of the free layer undergo crystallization and the dilution material(s) segregate to the sides of the free layer and, therefore, the sides of the magnetic junction 222.

Figure 11:
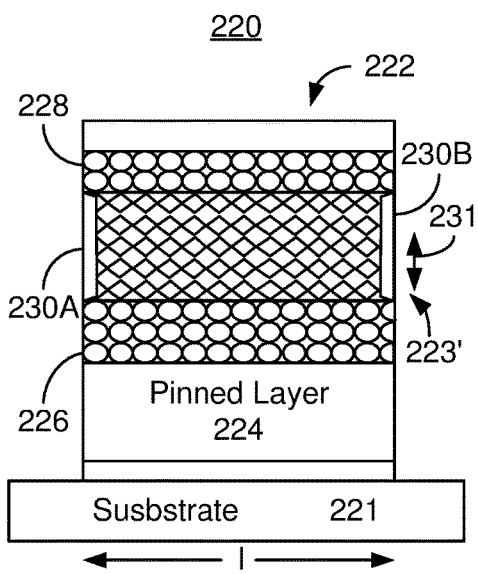

FIG. 11 depicts the magnetic junction 222 of the magnetic device 220 after the anneal. As can be seen in FIG. 11, the dilution material(s) 230A and 230B have segregated to the sides of the free layer 223'. The lattice of the free layer 223' has also templated off of the strained crystalline barrier layer 226 and strained optional PMA enhancement layer 228. Further, the free layer 223' is single crystal or nearly single crystal (larger grain size and fewer grains).

Figure 12:
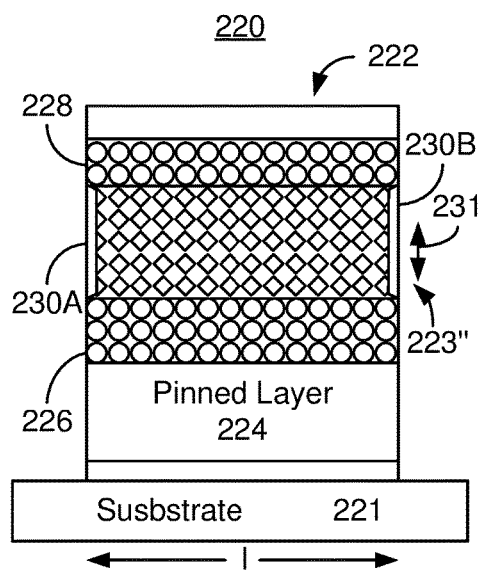

Fabrication of the magnetic device may then be completed, via step 158. Step 158 includes removing the applied voltage. Other structures, such as bit lines and/or word lines may also be formed. FIG. 12 depicts the magnetic junction 222 in the magnetic device 220 after step 158 is performed. Because the voltage has been removed, the tunneling barrier layer 226 is not subject to the stress due to the voltage. Thus, the free layer 223" that has already been crystallized and tunneling barrier layer 226 are no longer under the same stress as during the anneal. Because the free layer 223" has crystallized under stress the remnant stress, PMA and other characteristics may be tuned. Stated differently, these characteristics may be tuned using the voltage applied during annealing.

Using the method 140, the magnetic junction 222 may be formed. Such magnetic junctions may have a free layer with a high perpendicular magnetic anisotropy and may be a single crystal or contain only a few grains for lateral dimensions on the order of twenty nanometers or less. The dilution material(s) 230A and 230B may segregate to the edges of the free layer 243". The remaining magnetic material(s) form a crystal structure that templates off of the crystalline tunneling barrier layers 226 and 288. The free layer 243" grain size may be increased and the distribution of the properties of the free layer 243" may be narrowed. The free layer 243" may thus have the desired perpendicular magnetic anisotropy, coercivity, shift field and magnetoresistance. Thus, performance of the magnetic junction 222 may be improved.

Figure 13:
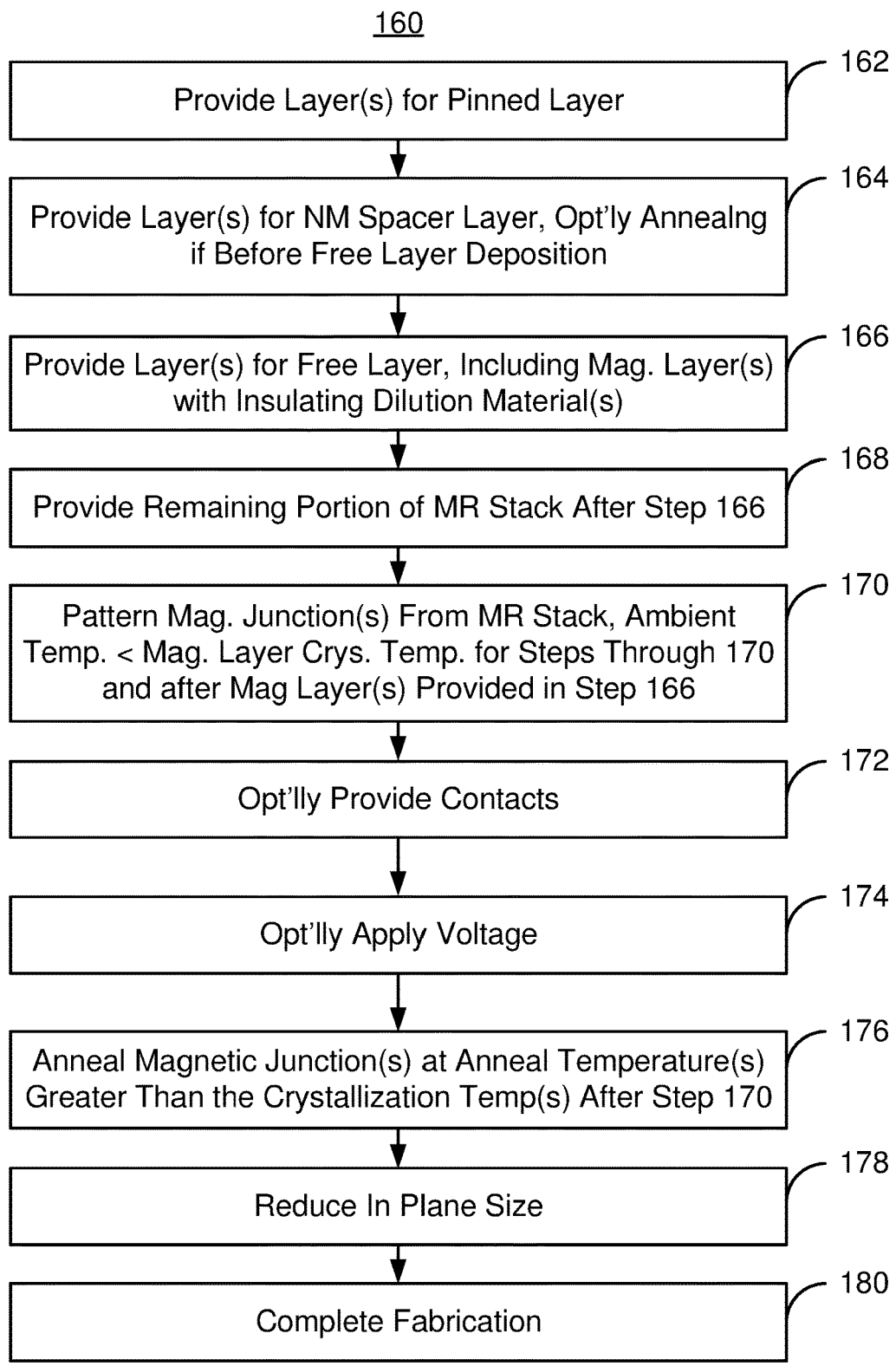
FIG. 13 is a flow chart depicting another exemplary embodiment of a method for providing a magnetic junction that may have a single crystal free layer at lateral dimensions not exceeding twenty nanometers and usable in magnetic devices such as a magnetic memory programmable using spin transfer torque.
Figure 14:
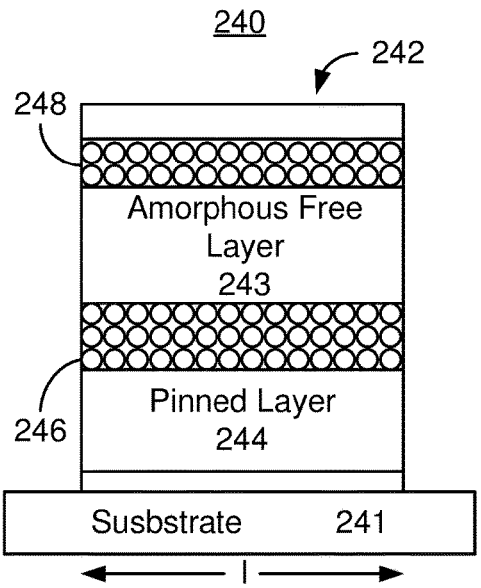
FIGS. 14-16 depict another exemplary embodiment of a magnetic junction during fabrication, which may have a single crystal free layer at lateral dimensions not exceeding twenty nanometers and usable in magnetic devices such as a magnetic memory programmable using spin transfer torque.
Figure 15:
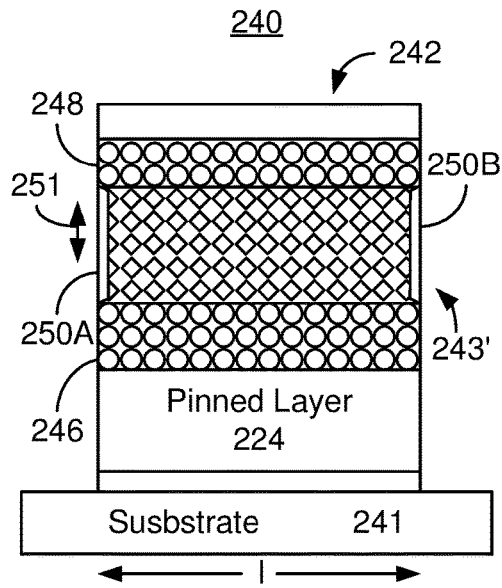
Figure 16:
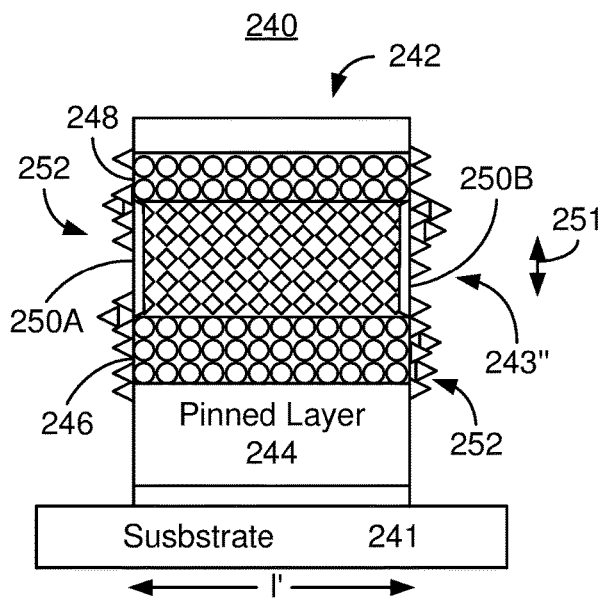

FIG. 13 is a flow chart depicting an exemplary embodiment of a method 160 for providing magnetic junction(s) that may have a single crystal free layer at lateral dimensions not exceeding twenty nanometers. FIGS. 14-16 depict an exemplary embodiment of a magnetic device 240 including magnetic junctions 242 during fabrication using the method 160. The magnetic device 240 may be an STT-MRAM or other analogous device. FIGS. 14-16 are not to scale and only structures of interest are separately labeled and included. Referring to FIGS. 13-16, the method 160 is described in the context of the magnetic device 240 including particular magnetic junctions 242. However, other magnetic devices including other magnetic junction(s) may be formed. For simplicity, some steps may be omitted, performed in another order, include substeps and/or combined. Further, the method 160 may start after other steps in forming a magnetic memory have been performed.

The layers for the pinned layer are provided, via step 162. Step 162 is analogous to steps 122 and 142. If the layers for the pinned layer are provided before the relevant magnetic layer(s) of the free layer in step 166 (discussed below), then step 162 may also include an anneal or other exposure of the layers to an ambient temperature in excess of the crystallization temperature(s) of the magnetic layer(s) of the free layer. However if step 162 is performed after the magnetic layers are provided in step 166, then step 162 includes ensuring that the portion magnetoresistive stack already formed is not exposed to an ambient temperature in excess of the free layer crystallization temperature(s).

The layer(s) for the nonmagnetic spacer layer are provided, via step 164. Step 164 is analogous to steps 124 and 144. If step 164 is performed before the relevant magnetic layer(s) of the free layer are provided in step 166, then an anneal may optionally be performed as part 64. Such an anneal may be used to crystallize the MgO layer in the desired orientation. If, however, step 164 is performed after the magnetic layer(s) of the free layer are formed in step 166, then step 164 includes ensuring that the portion magnetoresistive stack already formed is not exposed to an ambient temperature in excess of the free layer crystallization temperature(s).

The layer(s) for the free layer are provided, via step 166. Step 166 is analogous to steps 126 and 146. Step 166 thus includes depositing one or more magnetic layers that include magnetic material(s) and dilution materials. The magnetic material(s) include but are not limited to CoFe and Fe. In some embodiments, the dilution materials deposited in step 166 are insulators. The dilution material(s) may include but are not limited to materials such as Si, SiO and/or SiN. If steps 162, 164 and 166 are carried out in order, then the magnetic junctions being formed are either bottom pinned or dual magnetic junctions. If step 166 is performed before steps 162 and 164, then top pinned magnetic junctions are formed.

A remaining portion of the magnetoresistive stack is provided after the free layer have been deposited, via step 168. Step 168 is analogous to steps 128 and step 148. As discussed above, the ambient temperature remains or is maintained below the crystallization temperature of the free layer.

The magnetoresistive stack is then patterned, via step 170. Step 170 is analogous to steps 130 and 150. From deposition of the magnetic layer(s) of the free layer in step 166 through the patterning in step 170, the ambient temperature for the magnetoresistive stack and the magnetic junction(s) does not exceed the crystallization temperature of the free layer. In some cases, the ambient temperature is less than the crystallization temperature. The ambient temperature may be significantly less than the crystallization temperature is some embodiments. For example, the ambient temperature may be fifty degrees Celsius, one hundred degrees Celsius or more less than the crystallization temperature. Step 170 is performed such that the lateral dimensions of at least the free layer are not more than twenty nanometers. In some embodiments, the lateral dimensions of the free layer do not exceed ten nanometers. In some embodiments, the entire magnetic junction has lateral dimensions corresponding to those of the free layer.

FIG. 14 depicts an exemplary embodiment of one magnetic junction 242 in the magnetic device 240 after step 170 is performed. Thus, a magnetic junction 242 having lateral dimension I≤20 nm is formed. Although only one magnetic junction 240 is shown, multiple may be present in the device 240. A pinned layer 244, nonmagnetic spacer layer 246 and free layer 243 are shown on the substrate 241. Also shown is an optional PMA enhancement layer 248. Other layers may be present but are not shown for clarity. In the embodiment shown, the magnetic junction 242 is a bottom pinned magnetic junction. However, a top pinned or dual magnetic junction may be formed instead. As can be seen in FIG. 14, the free layer 243 is termed an amorphous free layer. This is because the magnetic layer(s) within the free layer that include both magnetic material(s) and dilution material(s) are amorphous as-deposited. As discussed above, the ambient temperature to which the layer(s) in the free layer are exposed are modest in comparison with the crystallization temperature of the magnetic layer(s) of the free layer. As a result, the free layer 243 remains amorphous after the magnetic junction 242 has been defined.

Electrical contacts may optionally be provided for the magnetic junction prior to the anneal, via step 172. However, a refill material is not provided between the magnetic junctions 242 at this time. Consequently, step 172 is generally omitted. A voltage is optionally applied to the magnetic junction 242 through the electrical contacts, via step 174. Thus, a voltage is developed between the top and the bottom of the magnetic junction 272. However, this step is also generally omitted. If performed, then the magnetic junction formed would be more analogous to the magnetic junction 222.

The magnetic junctions 242 are annealed at anneal temperature(s) not less than the crystallization temperature while the voltage is applied, via step 176. Step 176 occurs after the step of patterning the magnetoresistive stack in step 170. Thus, the magnetic junctions 242 are exposed to temperature(s) greater than or equal to the crystallization temperature(s) of the magnetic layer(s) of the free layer 243 for a desired amount of time. For example, the anneal may be at temperature(s) greater than three hundred. In some embodiments, the anneal temperature(s) may be at least three hundred twenty-five degrees Celsius. In some such embodiments, the anneal temperature(s) are at least three hundred fifty degrees Celsius. In some embodiments, the anneal temperatures may be four hundred degrees Celsius or more. Because of the anneal, the magnetic layer(s) of the free layer undergo crystallization and the dilution material(s) segregate to the sides of the free layer and, therefore, the sides of the magnetic junction 242.

FIG. 15 depicts the magnetic junction 242 of the magnetic device 240 after the anneal. As can be seen in FIG. 15, the dilution material(s) 250A and 250B have segregated to the sides of the free layer 243'. As discussed above, the dilution materials are insulating. Thus, the regions 250A and 250B may aid in electrically insulating the free layer 243'. The lattice of the free layer 243' has also templated off of the crystalline barrier layer 246 and optional PMA enhancement layer 248. Further, the free layer 243' is single crystal or nearly single crystal (larger grain size and fewer grains).

The lateral, or in-plane, size of the magnetic junction 242 is then reduced, via step 178. Step may include masking and ion beam etching the magnetic junction to make it smaller. FIG. 16 depicts the magnetic junction 242 after step 178 is completed. Thus, the lateral dimension of the magnetic junction 242 has been reduced to l'. As a result, the free layer 243" and segregated dilution materials 252 occupy less lateral space. In addition, redeposition 252 (shown as triangles in FIG. 16) has landed on the sides of the magnetic junction 243". This redeposition may be metallic. However, because of the presence of insulating dilution materials 250A and 250B, the free layer 243" may be electrically insulated. Thus the presence of the redeposition 252 is less likely to result in shunting of the magnetic junction 242.

Fabrication of the magnetic device may then be completed, via step 180. Step 180 includes removing the applied voltage, if any. The spaces around the magnetic junction 222 may be refilled with an insulating material and the electrical contacts provided. Other structures, such as bit lines and/or word lines may also be formed.

Using the method 160, the magnetic junction 242 may be formed. Such magnetic junctions may have a free layer with a high perpendicular magnetic anisotropy and may be a single crystal or contain only a few grains for lateral dimensions on the order of twenty nanometers or less. Use of the ion beam etch may further reduce the lateral dimensions of the magnetic junction. The dilution material(s) 250A and 250B may segregate to the edges of the free layer 243" and insulate the free layer 243". The remaining magnetic material(s) form a crystal structure that templates off of the crystalline tunneling barrier layers 246 and 248. The free layer 243" grain size may be increased and the distribution of the properties of the free layer 243" may be narrowed. The free layer 243" may thus have the desired perpendicular magnetic anisotropy, coercivity, shift field and magnetoresistance. Thus, performance of the magnetic junction 242 may be improved.

Although the method and apparatus have been described in the context of specific features, steps and components, one of ordinary skill in the art will recognize that one or more of these features, steps and/or components may be combined in other manners not inconsistent with the description herein.

Figure 17:
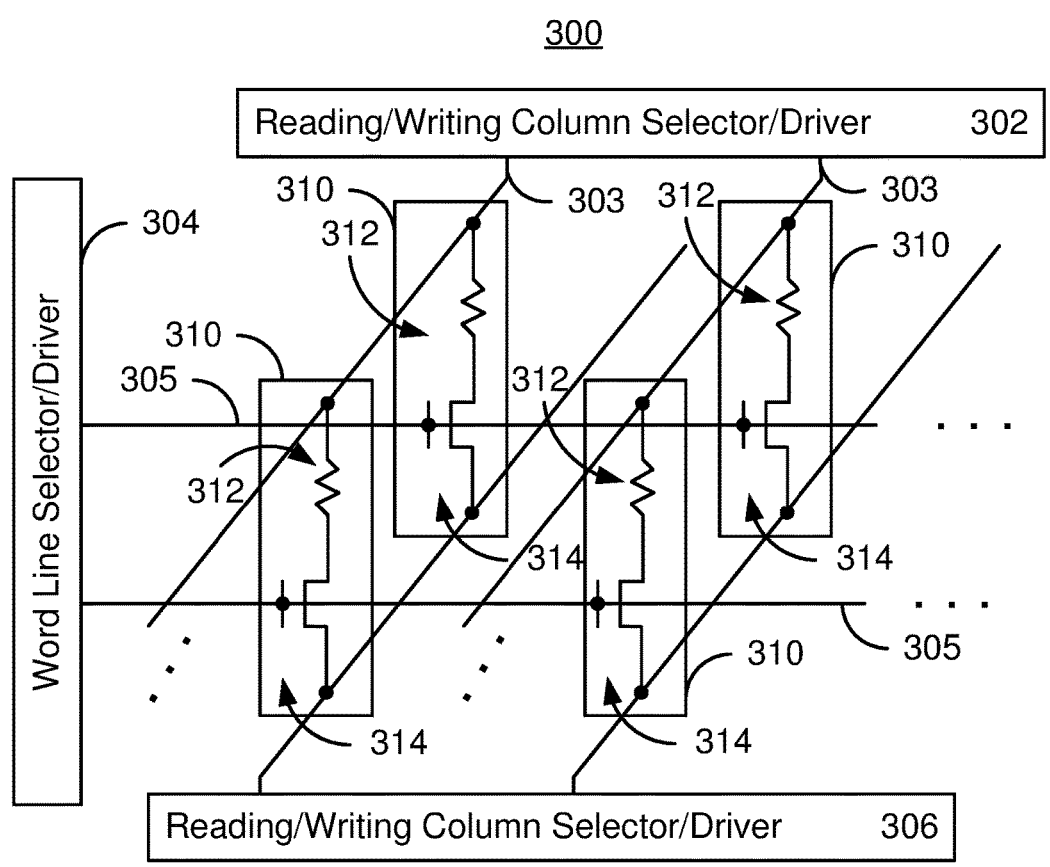
FIG. 17 depicts an exemplary embodiment of a memory utilizing magnetic junctions in the memory element(s) of the storage cell(s).

FIG. 17 depicts an exemplary embodiment of a memory 300 that may use one or more of the magnetic junctions 202', 202'', 222, 242 and/or other magnetic junction(s) formed in accordance with the methods described herein. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 202', 202'', 222, 242 and/or other magnetic junction(s) formed as disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction residing on a substrate and usable in a magnetic device, the method comprising:
   providing a first portion of a magnetoresistive stack corresponding to the magnetic junction, the step of providing the first portion of the magnetoresistive stack including providing at least one layer for a free layer of the magnetic junction;
   providing a second portion of the magnetoresistive stack after the step of providing the first portion of the magnetoresistive stack;
   patterning the magnetoresistive stack to provide the magnetic junction after the step of providing the second portion of the magnetoresistive stack, an ambient temperature for the magnetoresistive stack and the magnetic junction not exceeding a crystallization temperature of the free layer from completion of the step of providing the at least one layer for the free layer through the step of patterning the magnetoresistive stack, the step of patterning the magnetoresistive stack removing a portion of the at least one layer and defining a length of the free layer; and
   annealing the magnetic junction at an anneal temperature not less than the crystallization temperature after the step of patterning the magnetoresistive stack.

2. The method of claim 1 wherein the step of providing the first portion of the magnetoresistive stack further includes:
   providing at least a first layer for a pinned layer of the magnetoresistive junction; and
   providing at least a second layer for a nonmagnetic spacer layer, the nonmagnetic spacer layer being between the pinned layer and the free layer, the free layer being magnetic and switchable between a plurality of stable magnetic states when a write current is passed through the magnetic junction.

3. The method of claim 1 wherein the step of providing the second portion of the magnetoresistive stack further includes:
   providing at least a first layer for a pinned layer of the magnetoresistive junction; and
   providing at least a second layer for a nonmagnetic spacer layer, the nonmagnetic spacer layer being between the pinned layer and the free layer, the free layer being magnetic and switchable between a plurality of stable magnetic states when a write current is passed through the magnetic junction.

4. The method of claim 1 wherein the at least one layer for the free layer includes an amorphous as-deposited magnetic layer, the crystallization temperature being for the amorphous as-deposited layer.

5. The method of claim 1 wherein the ambient temperature does not exceed three hundred degrees Celsius.

6. The method of claim 5 wherein the anneal temperature is at least three hundred fifty degrees Celsius.

7. The method of claim 1 wherein the step of providing the free layer further includes:
   depositing a magnetic layer including a dilution material, the dilution material segregating in the step of annealing the magnetic junction.

8. The method of claim 7 wherein the dilution material includes at least one of Mo, B, Be, Si, SiO and SiN.

9. The method of claim 7 wherein the magnetic layer is amorphous as-deposited.

10. The method of claim 1 wherein the magnetic junction has a plurality of sides and wherein step of annealing the magnetic junction occurs while the plurality of sides of the magnetic junction are exposed.

11. The method of claim 1 further comprising:
   providing an electrical contact to the magnetic junction and wherein the step of annealing the magnetic junction occurs after the electrical contact has been provided.

12. The method of claim 11 wherein the step of annealing the magnetic junction further includes:
   applying a voltage to the magnetic junction during the anneal.

13. The method of claim 1 further comprising:
   reducing a size of the magnetic junction after the step of patterning the magnetic junction.

14. A method for providing a magnetic junction residing on a substrate and usable in a magnetic device, the method comprising: depositing at least a first layer of a magnetoresistive stack corresponding to a pinned layer of the magnetic junction; depositing at least a second layer of the magnetoresistive stack corresponding to a tunneling barrier layer of the magnetic junction; depositing a magnetic layer of the magnetoresistive stack, the magnetic layer including at least one dilution material and being amorphous as-deposited, a free layer of the magnetic junction including a portion of the magnetic layer, the at least second layer being between the at least first layer and the magnetic layer; patterning the magnetoresistive stack to provide the magnetic junction after the step of depositing the magnetic layer, an ambient temperature for the magnetoresistive stack and the magnetic junction not exceeding a crystallization temperature of the free layer from completion of the step of providing the free layer through the step of patterning the magnetoresistive stack, a side of at least the free layer being defined from the at least magnetic layer by the step of patterning the magnetoresistive and annealing the magnetic junction at an anneal temperature not less than the crystallization temperature after the step of patterning the magnetoresistive stack.

15. The method of claim 14 wherein the at least one dilution material includes at least one of Mo, B, Be, Si, SiO and SiN.

16. The method of claim 14 wherein the step of annealing the magnetic junction occurs while the magnetic junction is exposed to the environment.

17. The method of claim 14 further comprising:
providing a contact to the magnetic junction and wherein the step of annealing the magnetic junction occurs after a contact to the magnetic junction has been provided; and
applying a voltage to the magnetic junction during the anneal.

* * * * *